Figure 1:
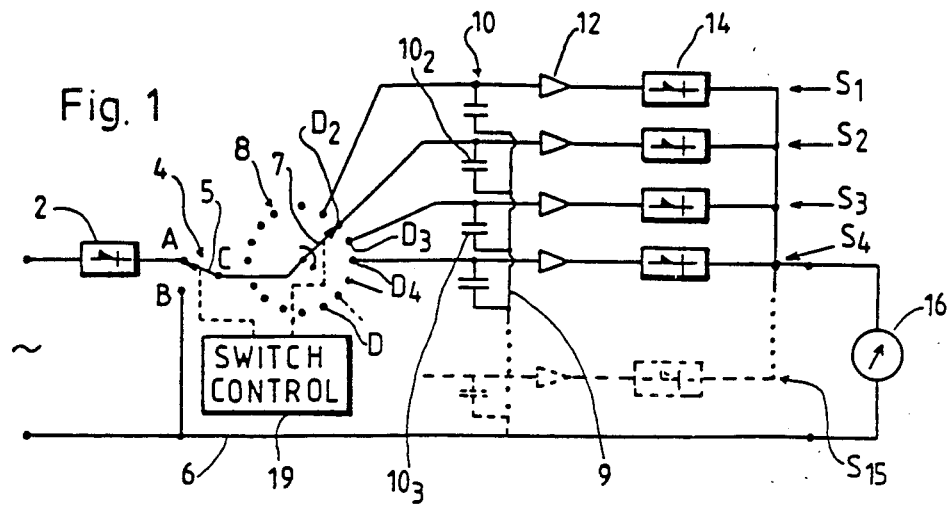

United States Patent [19]

Jensen

[11] Patent Number: 4,706,289

[45] Date of Patent: Nov. 10, 1987

[54] LEVEL INDICATING METHODS AND MEANS

[75] Inventor: Jorgen S. Jensen, Hjerm, Denmark

[73] Assignee: Band & Olufsen A/S, Struer, Denmark

[21] Appl. No.: 770,266

[22] Filed: Aug. 28, 1985

[30] Foreign Application Priority Data

Aug. 29, 1984 [DK] Denmark ............................ 1505/84

[51] Int. Cl.⁴ ............................................ G01R 19/16
[52] U.S. Cl. ...................................... 381/56; 381/58; 324/103 P
[58] Field of Search ............................ 381/56, 58, 59; 324/103 P, 111; 340/815.11, 660, 664; 307/351

[56] References Cited

U.S. PATENT DOCUMENTS

| | | | |
|---|---|---|---|
| 4,109,198 | 8/1978 | Ueno | 324/103 P |
| 4,183,025 | 1/1980 | Kutaragi | 324/103 P |
| 4,388,590 | 6/1983 | Richards | 324/103 P |
| 4,492,107 | 1/1985 | Sandhu | 381/56 |
| 4,528,501 | 7/1985 | Dorrough | 381/56 |
| 4,556,842 | 12/1985 | Rosswurm | 324/103 P |
| 4,581,759 | 4/1986 | Takahashi | 381/56 |

OTHER PUBLICATIONS

J. Pena, "Audible Sound Level Indicator," *Dev. Esp. Electron.*, vol. 25, No. 288, Nov. 1978, pp. 38-42.

*Primary Examiner*—Gene Z. Rubinson
*Assistant Examiner*—L. C. Schroeder
*Attorney, Agent, or Firm*—Antonelli, Terry & Wands

[57] ABSTRACT

A method and apparatus for continuously measuring and indicating the variations of the intensity of an electric signal, such as a signal to be recorded on a tape recorder, which provides measuring to take place at successive measuring periods in such a manner that a measured result is yielded representing the maximum value of the signal intensity. The signal intensity is measured during consecutive measuring periods and registered. The indicator has the ability to maintain the readout of a maximum value, read during a measuring period, during a following hold period, whereby the measuring periods provided have a duration being an order of size less than the time of reaction of the human eye. The system stores the maximum intensity values being detected during each of a series of consecutive measuring periods, and provides hold periods having substantially longer durations by being an order of size longer than the time of reaction of the human eye. The indicating means is connected so as to provide indication of the largest of the intensity values being registered within the series of consecutive measuring periods during the hold period. Hereby, a display of the varying intensity of a signal as an observable display of peak values of the intensity is achieved.

6 Claims, 3 Drawing Figures

LEVEL INDICATING METHODS AND MEANS

The invention relates to methods and means for continuous measuring of the intensity of an electrical signal, particularly of a recording signal in a tape recorder, in order to produce a likewise continuous, visual indication of the intensity.

Particularly in connection with the use of tape recorders it is important to be able to watch the variations of the instant intensity level of the recorded signal and thereby be able to control the general signal intensity in order to adapt it for correct recording, such that the tape is subjected to a suitably high, but not too high degree of magnetization. For example, it is desired that the signal to be recorded is level adjusted so that the recorded signal on the tape has an amplitude corresponding to the nature of the tape material. It is thus important to survey that the intensity peak values substantially do not exceed a given normalized value which is indicated by a corresponding mark on the intensity indicating device which can be a moving pointer indicator or a light spot indicator. It is a problem, however, that the intensity variations are often very large and very rapid, thus marking the perception or monitoring by an observer quite difficult. It is necessary, therefore, to adapt the indicator system to produce some sort of a tranquilized indication of the intensity variations, or a delay in the intensity variations which despite the introduced unnaturality or inaccuracy due to the delay thereof, show to the operator some relevant intensity levels and variations which enable the operator to adjust the general signal intensity to an appropriate level.

A known system for measuring and indicating the intensity of a signal is based on the so-called peak-level indication principle, according to which measuring values are produced corresponding to successive relative maximum levels of the signal intensity. The measuring of the signal intensity takes place by rectifying the signal and thus the peaks thereof and leading the resulting signal to a circuit comprising a condenser. This condenser will get charged by the rectified signal voltage and consequently present a measurable electrical potential. Said circuit is designed such that the charging time of the condenser is very short, i.e. the measurable condenser voltage will grow correspondingly rapidly by the appearance of a rapidly increasing signal intensity. On the other hand the discharge time of the capacitor is arranged to be considerably longer, viz. just so long that the value of the measurable potential will decrease suitably slowly after the relative maximum charging of the condenser to thereby produce a tranquilized or delayed response of the indicator to the effect that the human eye may perceive the variations even when they occur rapidly.

It is hereby possible to identify high peak levels of the signal intensity, whereby the general signal intensity or signal amplification may be adjusted accordingly to avoid distortion at the peak levels. However, the long discharge time of the condenser causes a substantial drawback with respect to the general monitoring of the changes of the peak levels in that the indicator cannot follow rapid decreases of the signal intensity. This may be unimportant from a pure distortion control point of view, but a trained operator will like to "read" the signal in more detail on the indicator, e.g. for noticing rapid series of changes, and with the known system rapid changes will be shown only as far as increases of the intensity are concerned. For instance, for the operator it may be essential from the indicated values to observe if, in case of speech signals, small periods of total silence occur. To make such periods distinguishable the discharge time for the capacitor has to be shortened, but with this system the peak values of short durations are difficult to observe, thus, in practice, this system is not very satisfactory. In addition, a rapid decrease and a following rapid increase, perhaps to a lower relative maximum value, may not be indicated at all.

According to another known system a more detailed monitoring of the variations of the signal intensity is obtainable by arranging for a practically instant indication of the mean value of the rectified signal. However, this may give rise to another problem, viz. that signal passages of a very rapidly changing intensity will not at all be readable, due to the reaction time of the human eye. Also, peak values of very short duration may not be indicated.

The two above known systems may provide for a satisfactory monitoring if they are used together, whether in a simultaneous or an alternating manner, but of course this can be no ideal solution.

It is the object of the invention to provide a method and a system, whereby an improved monitoring of the changing signal intensity is achievable in a simple manner.

According to the invention there is used memory means for memorizing the maximum intensity level as occurring in each of a continuous series of time intervals of a predetermined length, which is shorter than the reaction time of the human eye, and means operable in response to a decrease of the intensity level to hold the measuring value of lastly measured maximum intensity level and supply this measuring value to the indicator during a predetermined holding time interval which is only somewhat longer than the normal reaction time of the human eye.

Thus, whenever the signal intensity is rising, the indicator may follow this rise either directly or stepwise through steps of such short duration that the operator will not perceive them as "steps", i.e. physiologically the rise will be monitored in a true manner in both cases. When a relative maximum value is being passed and the intensity starts to decrease, the memory and holding means will provide to the indicator a signal or measuring value corresponding to the relevant maximum value, and this value will be maintained with an extended duration sufficient to make it observable by the human eye. Any very short intensity peak, therefore, will be prolonged to the effect that it is actually observable at the indicator, while otherwise the indicator will readily follow both rapid increases and rapid decreases of the intensity levels of the signal. The indications of the rapidly decreasing values may be slightly delayed, but they will nevertheless take place with the correct rate of decrease, and the operator, therefore, will obtain a visual picture of the signal which is as close as possible to the signal itself.

Figure 2:
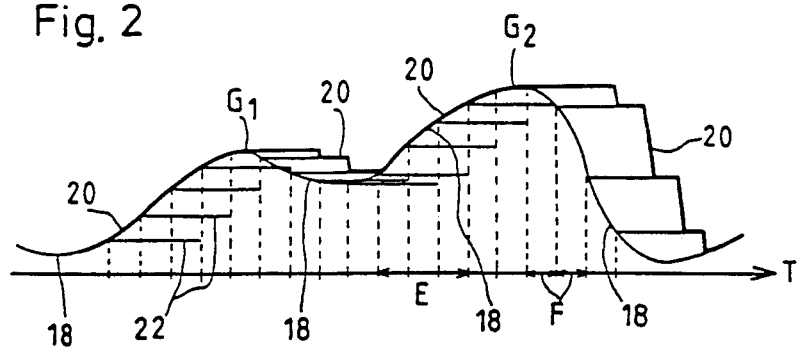
Figure 3:
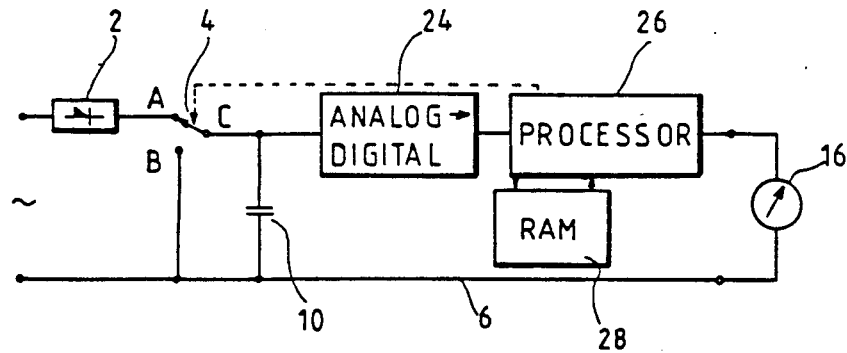

The invention will be explained further in the following with reference to the accompanying drawings, in which FIG. 1 is a schematic diagram of the main parts of an indicator circuit according to the invention, FIG. 2 is a graph representing a signal intensity including measured levels of intensity and associated indicator readings, and FIG. 3 is a schematic diagram of the main ingredients of a modified system of the invention.

FIG. 1 shows a rectifier circuit 2 comprising an input terminal and an output terminal, of which the latter is connected to a first contact A of a switchover switch 4 having a switch arm 5. Another contact B of said switch is connected to a wire 6 while a contact C for the switch arm 5 is connected to another switch arm 7 in a multiposition switch 8. Contacts D of said multiposition switch 8 are each connected to a respective condenser 10 and to an input terminal of a buffer amplifier 12. Said condensers 10 are, in their turn, all connected to said wire through a common wire 9. All output terminals of the buffers 12 are individually connected to respective input terminals of the rectifiers 14, the output terminals of which are in common connected to an indicator 16 which is also connected with the wire 6. For clearness only a small number of component sets 10,12,14 are shown, each designated $S_1$, $S_2,S_3$, etc. In a practical example some 15 parallel sets may be used, and the cycle time of the rotary switch arm 7 of the multiposition switch may be 150 msecs., whereby the switch arm 7 may rest, ideally, through some 10 msecs on each successive contact D.

A switch control unit 19 is provided for controlling and coordinating the operation of the two switches 4 and 8 in such a manner that for each new step taken by the switch arm 7 the switch arm 5 will be shifted first to position C-B and then back to position C-A.

In operation, therefore, when signal is applied to the input terminal of the rectifier 2 the rectified signal will be applied, in the example shown, to the component set $S_2$ as the switch 4 is shifted from C-B to C-A. Hereby the condenser 10 in that component set, designated $10_2$, will get rapidly charged to the voltage level of the signal, and the charge will follow the signal level if it is varying. Approximately 10 msecs thereafter, the switch arm 7 continues to the next contact $D_3$, and the switch arm 5 is shifted from position C-A to position C-B. A first effect of this shift is that the condenser $10_2$ will be left with a potential corresponding to the signal level at the moment the switch arm 7 left the switch contact $D_2$, because the associated buffer 12 will prevent a discharging through the indicator 16. A second effect is that the next condenser, $10_3$, will get discharged from any previous potential thereof, since this condenser is now shorted through the switch connection C-B and the wires 6 and 9. Rapidly thereafter and at least before the switch arm 7 moves to the next contact $D_4$ the switch arm 5 is switched back to the position C-A, whereby the condenser $10_3$ will get charged to the potential as now provided by the input signal. In this way, by the consecutive steps of the cyclically operating switch arm 7, the condensers 10 will get successively first discharged and then charged to the voltage level of the signal at each disconnection between the switch arm 7 and the respective contact D.

In other words, generally, the multiposition switch 8 will effect a sampling of the intensity curve of the signal at short intervals, and the condensers 10 will show the signal intensity at the end of the consecutive intervals, whereby the various intensity levels of the consecutive intervals will be continuously memorized by the condensers through a backlog period of 150 msecs.

It will be readily understood that the indicator 16 will at any time indicate the highest voltage level as stored in each and all of the condensers 10. In case of a rising voltage level of the signal each new condenser will be charged accordingly, whereby the indication will follow the rise in a true manner, though to some degree also in a stepwise manner. However, the steps are of a duration as short as 10 msecs, and such short steps are not really perceivable by the human eye, no matter how fast the increase is. Even some inertia of the indicator unit may provide for the same result. Furthermore, if the steps of 10 msecs are found to be "readable" with a given indicator unit it will of course be possible to choose a still shorter duration of the single steps.

Also by a decreasing intensity level the indicator 16 will be able to follow a very rapid decrease, inasfar as the condensers 10 are very rapidly discharged by the action of the switch 4, but it is here important that the indicator will still show the maximum value as provided by any of the condensers 10 during the last 150 msecs. By the passage of a short signal intensity peak, therefore, the indicator 16 will show the peak value and hold this showing during the following 150 msecs, no matter how rapidly the intensity decreases, while on the other hand the showing will follow even a very rapid decrease only with a general delay of some 150 msecs.

It has been found that a monitoring delay of the magnitude of only 150 msecs or somewhere between 100 and 200 msecs is fully acceptable to an operator wishing to visually read the intensity variations of the signal on the indicator 16, e.g. in order to determine how the sound signal will be experienced by a listener and to enable the operator to effect an associated relevant control of the signal.

Generally, therefore, the operator will be able to watch all relevant increases and decreases of the signal intensity, no matter how rapid they are, but it will be ensured that every occurring peak value of any significant duration, even if considerably shorter than the said 100-200 msecs, will be monitored with a duration sufficient to be clearly readable by the operator, i.e. the operator will experience a relatively calm and readable monitoring of intensity peaks of even very short durations, even when these durations are shorter than the reaction time of the human eye.

Peaks of such short duration as to occur inside the single short intervals of 10 msecs may not be monitored, when they have disappeared at the ends of the intervals, but normally such short peaks will be unimportant anyway. It may even be desirable to arrange for a circuit of well known type operable to generally suppress very short peaks, i.e. below 5 msecs. Such peaks or transients will often emanate from external sources of noise and will thus not belong to the signal to be monitored.

FIG. 2 shows a graph 18 drawn by a thin line representing a signal intensity and another curve 20 shown by a thick line, the two curves falling partly together. The time axis t is subdivided in intervals F corresponding to the stepping of the switch arm 7 of the multiposition switch 8. For each interval F is drawn a horizontal line 22 towards the right from the left starting point of the respective intervals, these lines 22 thus representing the signal intensity at the end of the preceding interval. Hereby the lines 22 will represent the voltage as stored in the consecutive condensers 10 during the operation of the system.

In FIG. 2 it is presumed, for clarity, that the complete cycle of the multiposition switch 8 includes four steps only, and the length of duration of three of these steps or intervals F is marked E, the lines 22 having just this length.

The curve 20 represents the reading or deflection of the indicator 16.

As the signal intensity 18 rises to a first peak $G_1$ the voltage rise will be almost steadily applied to the indicator 16 as the capacitors 10 get successively charged, i.e. the reading curve 20 will practically fall together with the level intensity curve 18. It will here be of no effect that the single capacitor voltages are memorized or maintained through the following three steps or intervals F.

As the peak $G_1$ is being passed the capacitors 10 will continue storing the voltages as occurring at the ends of the respective intervals F, but the indicator 16 will show the higher of the stored voltages, and as long as the relative maximum value is stored, during the following three intervals, it will be of no effect to the associated showing of the indicator that the signal intensity is now decreasing. Thus, until the end of the third following interval the reading will be kept constant, and during the fourth following interval the deflection of the indicator will be reduced corresponding to the next higher condenser voltage; this next higher voltage is cancelled already after one interval F, and thus the deflection will be reduced stepwise during the following intervals F of decreasing intensity, until an intensity increase occurs. Then again, an increasing intensity will be read out without delay, whereby the curves 18 and 20 will again follow each other rather closely until a new peak passage. As shown most clearly to the right of the following peak, $G_2$, the decending reading curve portions are slightly inclined, which is meant to reflect some inertia of the indicating system itself. However, the movements are so rapid that the stepwise motion will be perceived as a continuous motion. Besides, the possible step motion will in practice be smoothened by virtue of the cyclic switch 8 preferably having much more than just four steps.

As clearly illustrated by FIG. 2 the main effect is that the indication of the peaks $G_1$ and $G_2$ will be prolonged such that they will now be visually perceivable despite a very short duration thereof, while otherwise the monitoring of the increases and decreases of the signal intensity level will take place very rapidly, though with a slight delay in the showing of the decreasing values.

The reading curve 20 does not go entirely down to the relative minimum value of the intensity curve 18 between the two peaks $G_1$ and $G_2$, but this will be without any practical importance.

FIG. 3 shows a modified arrangement, in which only a single condenser 10 is used, arranged directly between the terminal C of the switch-over switch 4 and the wire 6. The terminal C is additionally connected to an input terminal of an analog/digital converter unit 24, the output of which is fed to a processor 26 as connected to the indicator 16. The processor 26 is also connected with a memory unit 28 of the RAM-type.

The processor 26 operates to control the operation of the switch 4, again so as to establish the connection C-B at the beginning of each interval F and thereafter the connection C-A during a last portion of the interval, to effect respective, sequential dischargings and rechargings of the condenser 10.

By the end of each interval F the voltage of the condenser 10 is read into the processor 26 through the converter 24, and the value is both passed further to the indicator 16 and stored in the memory unit 28. This unit is operable to store, consecutively, a predetermined number of measuring values, and when the number is full each new value will be stored at the expense of the "oldest" value, which is correspondingly cancelled, equivalent to the cyclic operation of the system according to FIG. 1.

The memory unit 28 is designed such that it will steadily present to the indicator 16 all the stored values thereof and thus also the stored maximum value, whereby the indicator 16 will monitor a maximum value whether it is received directly from the converter 24 or from the memory unit 28.

Hereby a rising intensity signal will be fed directly or immediately to the indicator 16, while for a dereasing intensity signal the indicator 16 will react to the maximum signal as provided by the memory unit 28, whereby the operation of the system will be entirely equivalent with the operation of the system according to FIG. 1.

It should be mentioned that the described design and operation of the various electronic units of the system according to FIG. 3 are deemed to be self-explanatory to any expert in the relevant art, such that a more detailed description of the circuits and units should not be required here.

What is claimed is:

1. A method of continuously measuring and indicating variations of the intensity of an electric signal, particularly a signal to be recorded by means of a tape recorder, including the step of:
   measuring the electric signal at successive measuring periods in such a manner that a measuring result is yielded which represents the maximum value of the signal intensity to occur during the measuring period, said maximum value being maintained by an associated indicating device during a following hold period, as the intensity signal decreases;
   whereby the measuring of the maximum values is carried out in consecutive measuring periods having a duration being an order of size longer than the reaction time of a human eye; and
   whereby said hold period has a substantially longer duration by being an order of size longer than the reaction time of a human eye.

2. A method according to claim 1, whereby the measuring periods are provided by cyclically switching between a series of measuring circuits, with a cycle time corresponding to the duration of said hold period, and whereby during the cycle time an indicated read-out of the maximum occurring measured value in all measuring circuits takes place.

3. A method according to claim 1, whereby the measuring periods are provided by consecutively connecting a measuring circuit output to a memory shift register having a capacity which at the respective shift frequency corresponds to the length of the hold period, and whereby during said holding period an indicated read-out of the maximum occurring measuring value in the shift register takes place.

4. A device which is suited for the carrying out of method according to claim 1, comprising an indicating means for indicating the intensity level of an electric audio signal and means for continuously measuring and registering the signal intensity during consecutive measuring periods, said means for indicating being adapted to maintain a read-out of the maximum value of the signal to occur during the measuring period, for a following hold period;
   said measuring periods having a duration being an order of size less than the reaction time of a human eye, and said hold periods having substantially longer durations by being an order of size longer than the reaction time of a human eye; and means for storing the maximum intensity values being detected during each of a series of consecutive measuring periods;

whereby said indicating means is connected to provide indication of the largest of the intensity values which are registered within the series of consecutive measuring periods during said hold period.

5. A method according to claim 1, whereby said indicating device indicates increases in the intensity signal substantially at the same time that the increases actually occur, and indicates decreases in the intensity signal substantially at a time delayed by said hold period.

6. A device according to claim 4, whereby said indicating device indicates increases in the intensity signal substantially at the same time that the increases actually occur, and indicates decreases in the intensity signal substantially at a time delayed by said hold period.

* * * * *